(12) United States Patent
Lee et al.

(10) Patent No.: US 8,969,894 B2
(45) Date of Patent: Mar. 3, 2015

(54) LIGHT EMITTING DIODE WITH A MICRO-STRUCTURE LENS HAVING A RIDGED SURFACE

(75) Inventors: Hsiao-Wen Lee, Hsinchu (TW); Shang-Yu Tsai, Hsinchu (TW); Pei-Wen Ko, Zhubei (TW)

(73) Assignee: TSMC Solid State Lighting Ltd., Hsinchu (TW)

(*) Notice: Subject to any disclaimer, the term of this patent is extended or adjusted under 35 U.S.C. 154(b) by 233 days.

(21) Appl. No.: 13/087,564

(22) Filed: Apr. 15, 2011

(65) Prior Publication Data

US 2012/0261690 A1 Oct. 18, 2012

(51) Int. Cl.
*H01L 33/00* (2010.01)
*H01L 33/58* (2010.01)
*H01L 33/50* (2010.01)
*H01L 33/60* (2010.01)

(52) U.S. Cl.
CPC ............. *H01L 33/58* (2013.01); *H01L 33/50* (2013.01); *H01L 33/60* (2013.01)
USPC ................................. 257/98; 257/99; 257/100

(58) Field of Classification Search
USPC ............. 257/89, 98, 100, 95, 99, E33.059, 257/E33.068, E33.073, E33.066, E33.055
See application file for complete search history.

(56) References Cited

U.S. PATENT DOCUMENTS

| 7,381,996 B2 * | 6/2008 | Hsin Chen .................... 257/100 |
| 2002/0141006 A1 * | 10/2002 | Pocius et al. .................... 359/15 |
| 2004/0084681 A1 * | 5/2004 | Roberts ........................... 257/79 |
| 2005/0145867 A1 * | 7/2005 | Yau et al. ......................... 257/98 |
| 2006/0245195 A1 * | 11/2006 | Kim et al. ...................... 362/294 |
| 2007/0194337 A1 * | 8/2007 | Kondo ............................. 257/98 |
| 2008/0079017 A1 * | 4/2008 | Loh et al. ......................... 257/98 |
| 2009/0146158 A1 * | 6/2009 | Park ................................. 257/89 |
| 2009/0237956 A1 * | 9/2009 | Huang et al. .................. 362/555 |
| 2010/0277925 A1 * | 11/2010 | Tan et al. ........................ 362/304 |
| 2011/0057217 A1 * | 3/2011 | Peng et al. ........................ 257/98 |
| 2011/0291132 A1 * | 12/2011 | Liu et al. ........................... 257/98 |

FOREIGN PATENT DOCUMENTS

| CN | 101026285 A | 8/2007 |
| CN | 101539266 A | 9/2009 |
| WO | WO 2007/004775 A1 | 1/2007 |

* cited by examiner

*Primary Examiner* — Bilkis Jahan
(74) *Attorney, Agent, or Firm* — Haynes and Boone, LLP

(57) ABSTRACT

A light emitting diode (LED) with a micro-structure lens includes a LED die and a micro-structure lens. The micro-structure lens includes a convex lens portion, at least one concentric ridge structure surrounding the convex lens portion, and a lower portion below the convex lens portion and the at least one concentric ridge structure. The lower portion is arranged to be disposed over the LED die. A first optical path length from an edge of the LED die to a top center of the microstructure lens is substantially the same as a second optical path length from the edge of the LED die to a side of the micro-structure lens.

20 Claims, 6 Drawing Sheets

LIGHT EMITTING DIODE WITH A MICRO-STRUCTURE LENS HAVING A RIDGED SURFACE

TECHNICAL FIELD

The present disclosure relates generally to a light emitting diode (LED) and more particularly to a LED with a micro-structure lens.

BACKGROUND

For a primary LED lens design, light-extraction efficiency and spatial color shift characteristics are important factors. The primary LED lens will affect secondary optical design and backend product applications. A conventional dome lens may improve light extraction performance, but it would have undesirable spatial color shift due to different optical path lengths in different directions.

BRIEF DESCRIPTION OF THE DRAWINGS

Reference is now made to the following descriptions taken in conjunction with the accompanying drawings, in which.

DETAILED DESCRIPTION

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

Figure 1:
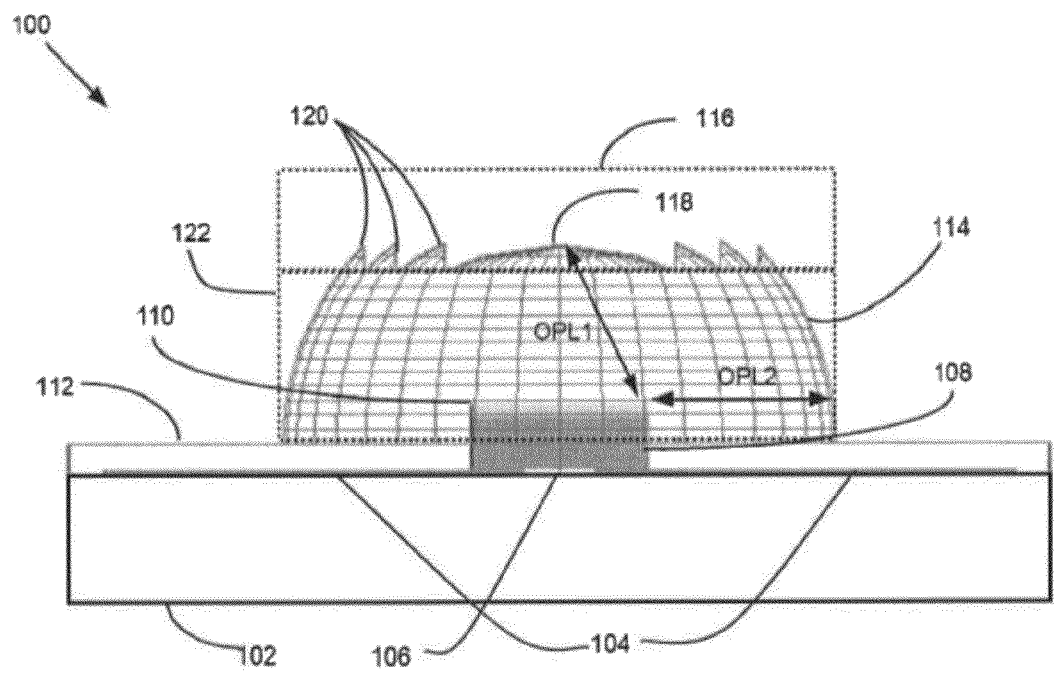
FIG. 1 is a schematic diagram showing an exemplary LED with a micro-structure lens according to some embodiments.

FIG. 1 is a schematic diagram showing an exemplary LED with a micro-structure lens according to some embodiments.

An LED assembly 100 includes a substrate 102 and an LED die 108. A reflective layer 104, e.g., silver (Ag), is formed on the substrate 102, e.g., silicon (Si). The LED die 108 is mounted on the substrate 102, e.g., by bonding using a solder layer 106. The size of the LED die 108 varies depending on applications, e.g., 300 μm-2000 μm. For low power applications, the LED die 108 may have a size of 300 μm-600 μm; while for high power applications, the LED die 108 may have a size of about 1000 μm or more.

A phosphor coating 110 is deposited over the LED die 108 to form a desired light color from the LED assembly 100. For example, the color of light emitted by the LED die 108, e.g., made of InGaN, may be blue, and a yellow phosphor material, e.g., cerium-doped yttrium aluminum garnet ($Ce^{3+}$:YAG), can be used to form a white light. Also, depending on the specific material and the thickness of the phosphor coating 110, e.g., 30 μm-60 μm, the light color can be changed. The phosphor coating 110 can use various materials, which are known in the art. The phosphor particle size can range, e.g., 6 μm-30 μm, in some embodiments. The phosphor material can form a conformal coating on the LED die 108 by controlled dispensing of the phosphor, e.g., spraying.

A micro-structure lens 114, including a micro-structure 116 on top and a lower portion 122, is molded over the substrate 102 and the LED die 108, which also forms a lens base layer 112 at the same time. The size of the micro-structure lens 114 varies depending on applications, and its diameter can be about 2.5 times of the size of the LED die 108. The micro-structure lens 114 and the lens base layer 112 can comprise silicon (Si), for example. The micro-structure 116 includes at least one concentric ridge structures 120 in addition to a convex lens portion 118. The micro-structure 116 can have a similar structure as a Fresnel lens structure, but not limited to it. Different structures are shown below in FIGS. 2A-4A. The lower portion 122 is shaped to enhance light extraction efficiency, e.g., as a part of a dome lens, where the top part of the dome lens is replaced by the micro-structure 116.

In general, the reflection at the surface of an LED lens is reduced by using a dome-shaped (half-sphere or hemisphere) package with the LED at the center so that the outgoing light rays strike the surface perpendicularly, at which angle the reflection is minimized. The reflective layer 104 on the substrate 102 increases the LED efficiency. The refractive index of the package material can also match the refractive index of the LED (semiconductor), to minimize back-reflection. An anti-reflection coating may be added as well.

The micro-structure lens 114 is designed to make optical path length (OPL) between the LED die 108 and the lens surface uniform as much as possible, thus improving the spatial color uniformity and still have high light extraction efficiency from the LED assembly 100. For example, a first length OPL1 from an edge of the LED die 108 to the top center of the micro-structure lens 114 (or the convex lens portion 118) and a second length OPL2 from the edge of the LED die 108 to the side of the micro-structure lens 114 are substantially the same.

In comparison, a conventional dome lens would have a hemispherical structure and the same radius from the center of the hemisphere to the top and a side of the dome lens. Because of the size of the LED die 108, the OPL from an edge of the LED die 108 to the top and a side of the dome lens would be substantially different. For example, the diameter of the conventional dome lens can be about 2.5 times of the length of the LED die 108. Assuming the length of the LED die 108 (positioned at the center of a hemispherical dome lens) is about 300 μm, the diameter of the dome lens can be about 750 µm, and the difference of OPL can be more than 100 µm, Due to the large difference in OPL, a significant special color shift will result for the conventional dome lens, e.g., a yellow ring at the edge of a white light LED.

In one exemplary design for the micro-structure lens 114, a dome type lens is designed first, using an optical design software. The lens shape is hemispherical to enhance the light extraction efficiency of the LED assembly 100. Then the height of the dome lens can be reduced. by using a micro-structure 116. The optical design software can be used to optimize the lens structure performance (e.g., high light extraction efficiency and enhanced color uniformity).

For the fabrication of the LED assembly 100, a substrate (e.g., Si) 102 is provided, and a reflective layer 104 is formed on the substrate 102. A bare LED die 108 is bonded on a substrate 102, e.g., using a solder layer 106 that is disposed over the reflective layer 104. A conformal phosphor coating 110 is formed. The phosphor coating 110 has a relatively small particle size, e.g., 6 µm-30 µm, forming a thin phosphor layer, e.g., 30 µm-60 µm, in some embodiments.

For the fabrication of micro-structure lens 114, the lens shape is molded using a lens molding instrument. A lens molding process is known in the art. If the details of the micro-structure lens 114, e.g., the ridge structures 120, are not well defined with precision, a dry/wet etching process can be used to obtain better defined structures after molding. The ridge structures 120 have a height/depth of about 3 µm-5 µm in some embodiments.

Figure 2A:
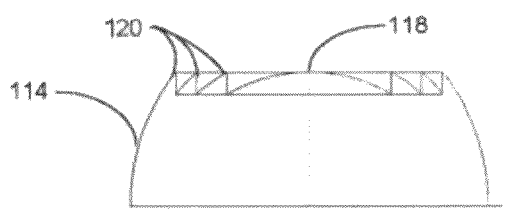
FIG. 2A is a schematic diagram showing a side view of an exemplary micro-structure lens for an LED according to some embodiments.
Figure 2C:
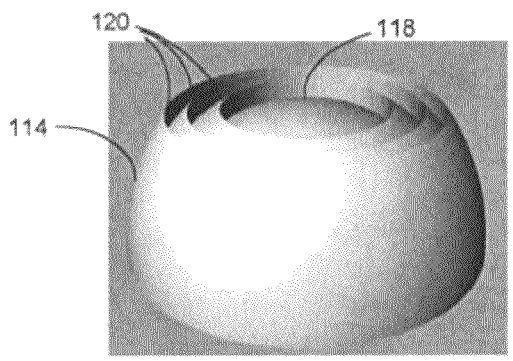
FIG. 2C is a schematic diagram showing a three-dimensional view of the exemplary micro-structure lens for the LED in FIG. 2A.
Figure 2B:
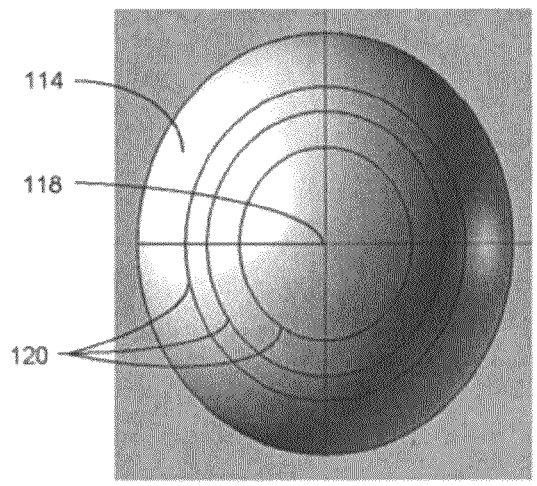
FIG. 2B is a schematic diagram showing a top view of the exemplary micro-structure lens for the LED in FIG. 2A.

FIG. 2A is a schematic diagram showing a side view of an exemplary micro-structure lens 114 for an LED according to some embodiments. The micro-structure lens 114 has three concentric ridge structures 120 and a convex lens portion 118 on top in FIG. 2A. The three concentric ridge structures 120 have pointed peaks, similar to a Fresnel lens structure. As mentioned above, if the details of the micro-structure lens 114, e.g., the ridge structures 120, are not well defined with precision after the lens molding, a dry/wet etching process can be used to obtain better defined structures. FIG. 2B is a schematic diagram showing a top view of the exemplary micro-structure lens 114 for the LED in FIG. 2A. FIG. 2C is a schematic diagram showing a three-dimensional view of the exemplary micro-structure lens 114 for the LED in FIG. 2A.

Figure 3A:
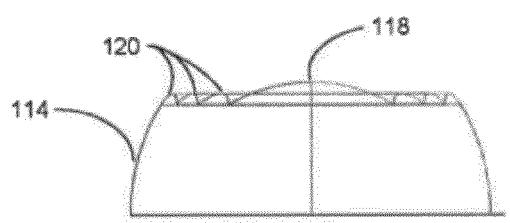
FIG. 3A is a schematic diagram showing a side view of another exemplary micro-structure lens for an LED according to some embodiments.
Figure 3C:
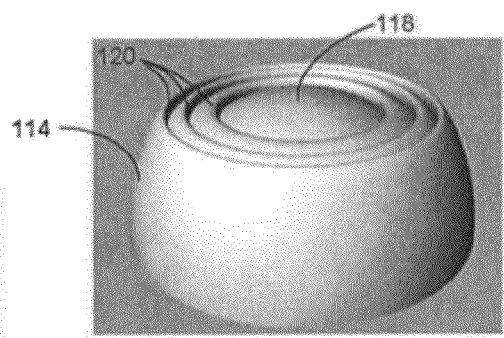
FIG. 3C is a schematic diagram showing a three-dimensional view of the exemplary micro-structure lens for the LED in FIG. 3A.
Figure 3B:
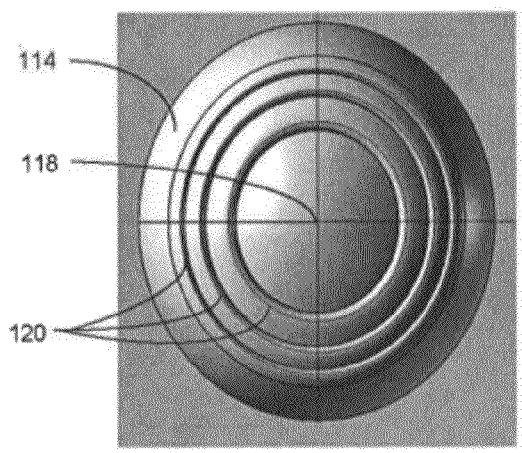
FIG. 3B is a schematic diagram showing a top view of the exemplary micro-structure lens for the LED in FIG. 3A.

FIG. 3A is a schematic diagram showing a side view of another exemplary micro-structure lens 114 for an LEI) according to some embodiments. Compared to the exemplary micro-structure lens in FIG. 2A, the top of the concentric ridge structures 120 are not pointed, but rather curved in FIG. 3A. The height of the concentric ridge structures 120 are the same as each other, but he top of the convex lens portion 118 is higher than the top of the ridge structures 120. The different lens designs are selected for different implementations and applications, based on performances (simulated or experimental), and ease of fabrication, etc. FIG. 3B is a schematic diagram showing a top view of the exemplary micro-structure lens 114 for the LED in FIG. 3A. FIG. 3C is a schematic diagram showing a three-dimensional view of the exemplary micro-structure lens 114 for the LED in FIG. 3A.

Figure 4A:
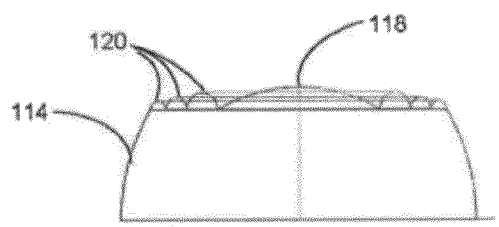
FIG. 4A is a schematic diagram showing a side view of yet another exemplary micro-structure lens for an LED according to some embodiments.
Figure 4C:
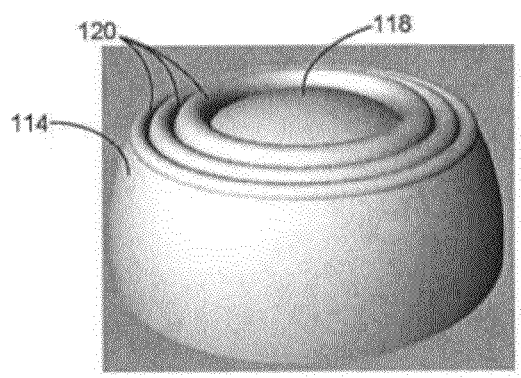
FIG. 4C is a schematic diagram showing a three-dimensional view of the exemplary micro-structure lens for the LED in FIG. 4A.
Figure 4B:
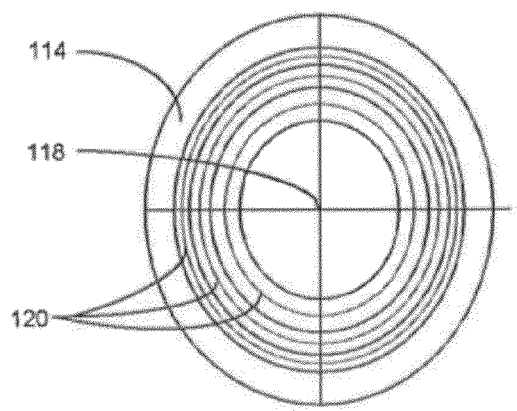
FIG. 4B is a schematic diagram showing a top view of the exemplary micro-structure lens for the LED in FIG. 4A.

FIG. 4A is a schematic diagram showing a side view of yet another exemplary micro-structure lens 114 for an LED according to some embodiments. The top of the concentric ridge structures 120 are circular instead of triangular, and the height of the concentric ridge structures 120 are different from each other in FIG. 4A. The diameter and height of the concentric ridge structures 120 increase as they get closer to the center of the micro-structure lens 114. The top of the convex lens portion 118 is higher than the top of the ridge structures 120. FIG. 4B is a schematic diagram showing a top view of the exemplary micro-structure lens 114 for the LED in FIG. 4A. FIG. 4C is a schematic diagram showing a three-dimensional view of the exemplary micro-structure lens 114 for the LED in FIG. 4A.

Figure 5:
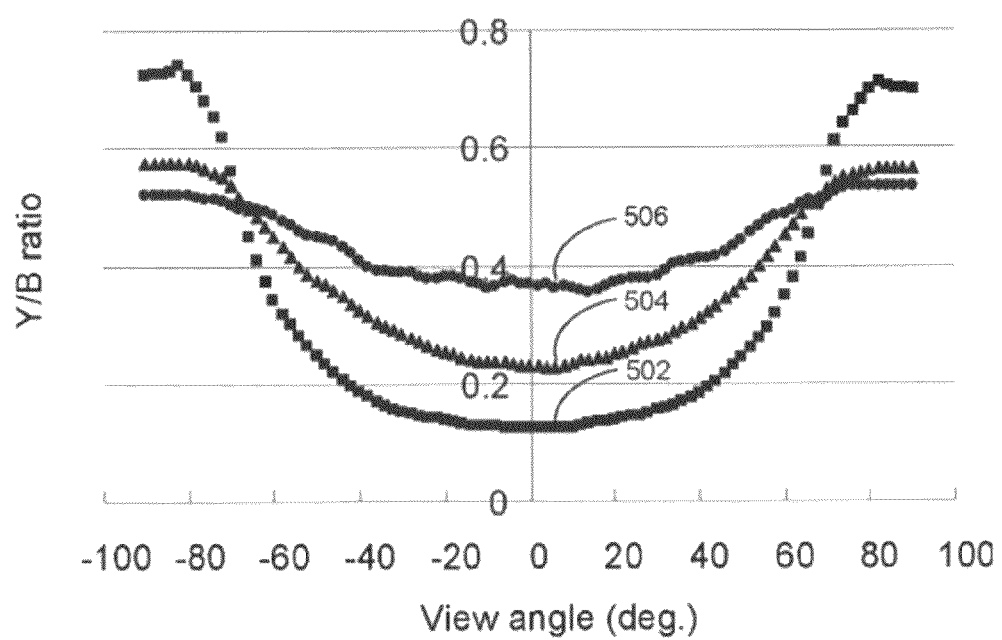
FIG. 5 is a plot showing Y/B ratio of various LEDs according to some embodiments.

FIG. 5 is a plot showing a yellow/blue (Y/B) ratio of various LEDs according to some embodiments. A Y/B ratio plot 502 of an LED without any lens shows a very low value (predominantly blue) at the center (low view angle), and increases (predominantly yellow) to either side edges (high view angles on either side). The Y/B ratio varies from about 0.13 to about 0.75. A Y/B ratio plot 504 of an LED with a conventional lens shows similar trends, and the Y/B ratio varies from about 0.23 to about 0.58. Compared to those two plots, a Y/B ratio plot 506 of an LED with an exemplary micro-structure lens 114 shows improved color distribution uniformity. The Y/B ratio varies from about 0.38 to about 0.53 in this example.

Figure 6:
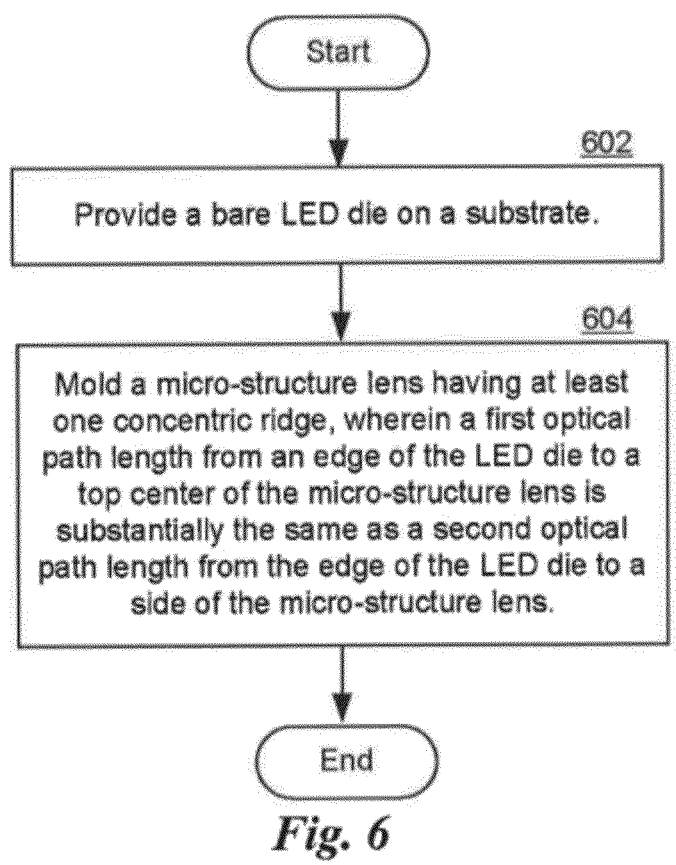
FIG. 6 is a flowchart of a method for fabricating the exemplary LED with a micro-structure lens in FIG. 1 according to some embodiments.

FIG. 6 is a flowchart of a method for fabricating the exemplary LED with a micro-structure lens in FIG. 1 according to some embodiments. At step 602, a light emitting diode (LED) die on a substrate is provided. At step 604, the micro-structure lens that has at least one concentric ridge is molded over the LED die. A first optical path length from an edge of the LED die to a top center of the micro-structure lens is substantially the same as a second optical path length from the edge of the LED die to a side of the micro-structure lens.

In various embodiments, a reflective layer is formed on the substrate. A solder layer is formed on the reflective layer. The LED die is bonded to the substrate. The LED die is wire bonded. A phosphor coating is formed on the LED die. The micro-structure lens is etched after molding.

According to some embodiments, a light emitting diode (LED) with a micro-structure lens includes a LED die and a micro-structure lens. The micro-structure lens includes a convex lens portion, at least one concentric ridge structure surrounding the convex lens portion, and a lower portion below the convex lens portion and the at least one concentric ridge structure. The lower portion is arranged to be disposed over the LED die. A first optical path length from an edge of the LED die to a top center of the micro-structure lens is substantially the same as a second optical path length from the edge of the LED die to a side of the micro-structure lens.

According to some embodiments, a method of fabricating a light emitting diode (LED) with a micro-structure lens includes providing a light emitting diode (LED) die on a substrate. The micro-structure lens is molded that has at least one concentric, ridge over the LED die. A first optical path length from an edge of the LEI) die to a top center of the micro-structure lens is substantially the same as a second optical path length from the edge of the LED die to a side of the micro-structure lens.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed. embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. A light emitting diode (LED) with a micro-structure lens, comprising:
    a LED die;
    a phosphor layer disposed over and vertically aligned with the LED die; and
    a micro-structure lens disposed over the LED die, the micro-structure lens including:
        a convex lens portion; and
        at least one concentric ridge structure surrounding the convex lens portion;
    wherein a first optical path length from an edge of the LED die to a top center of the micro-structure lens is substantially the same as a second optical path length from the edge of the LED die to a side of the micro-structure lens, and wherein the convex lens portion is wider than the LED die.

2. The LED of claim 1, wherein the micro-structure lens comprises silicon (Si).

3. The LED of claim 1, wherein the at least one concentric ridge structure has the same height as the convex lens portion.

4. The LED of claim 1, wherein the at least one concentric ridge structure has a lower height compared to the convex lens portion.

5. The LED of claim 1, wherein a first concentric ridge of the at least one concentric ridge structure closer to a center of the micro-structure lens has a higher height than a second concentric ridge of the at least one concentric ridge structure.

6. The LED of claim 1, wherein the at least one concentric ridge has a circular shape.

7. The LED of claim 1, wherein the at least one concentric ridge has an oval shape.

8. The LED of claim 1, further comprising a lens base layer disposed laterally around the LED die, wherein the micro-structure lens is disposed over the lens base layer.

9. The LED of claim 1, wherein the convex lens portion and the at least one concentric ridge structure collectively make up an entire upper surface of the micro-structure lens.

10. The LED of claim 1, wherein an entire upper surface of the LED die is covered by the phosphor layer.

11. The LED of claim 1, further comprising a reflective layer below the LED die disposed on a substrate.

12. The LED of claim 11, wherein the reflective layer comprises silver (Ag).

13. The LED of claim 11, further comprising a solder layer disposed over the reflective layer.

14. A light emitting diode (LED) with a micro-structure lens, comprising:
    a substrate having a reflective layer;
    a LED die disposed over the reflective layer;
    a phosphor coating disposed over the LED die, wherein the phosphor coating is vertically aligned with the LED die; and
    a micro-structure lens disposed over the LED die, the micro-structure lens including:
        a convex lens portion; and
        at least one concentric ridge structure surrounding the convex lens portion;
    wherein a first optical path length from an edge of the LED die to a top center of the micro-structure lens is substantially the same as a second optical path length from the edge of the LED die to a side of the micro-structure lens, and wherein the convex lens portion has a greater lateral dimension than the LED die.

15. The LED of claim 14, further comprising a solder layer disposed over the reflective layer.

16. The LED of claim 14, further comprising a lens base layer disposed laterally around the LED die, wherein the micro-structure lens is disposed over the lens base layer.

17. A light emitting structure, comprising:
    a light-emitting diode (LED) die;
    a phosphor material disposed over and vertically aligned with the LED die; and
    a lens disposed over the LED die, the lens including:
        a convex lens surface; and
        a concentric ridge structure circumferentially surrounding the convex lens surface in a top view;
    wherein the convex lens surface is wider than the LED die, and wherein a side surface of the lens is curved, and wherein a first optical path length from an upper edge of the LED die to the convex lens surface is substantially the same as a second optical path length from a lateral edge of the LED die to the side surface of the lens.

18. The light emitting structure of claim 17, further comprising:
    a lens base layer disposed laterally around the LED die, wherein the lens is disposed over the lens base layer; and
    a reflective layer below the LED die disposed on a substrate.

19. The light emitting structure of claim 17, wherein the concentric ridge structure has at least one of: a pointed peak or a curved peak.

20. The light emitting structure of claim 17, wherein an entirety of an upper surface of the LED die is covered by the phosphor material.

* * * * *